United States Patent
Cheng et al.

(10) Patent No.: US 8,792,292 B2
(45) Date of Patent: Jul. 29, 2014

(54) PROVIDING ROW REDUNDANCY TO SOLVE VERTICAL TWIN BIT FAILURES

(75) Inventors: Hong-Chen Cheng, Hsin-Chu (TW); Jung-Ping Yang, Juibei (TW); Chung-Ji Lu, Fongyuan (TW); Derek C. Tao, Fremont, CA (US); Cheng Hung Lee, Hsin-Chu (TW); Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 339 days.

(21) Appl. No.: 13/046,625

(22) Filed: Mar. 11, 2011

(65) Prior Publication Data

US 2012/0230127 A1  Sep. 13, 2012

(51) Int. Cl.
*G11C 29/00* (2006.01)
(52) U.S. Cl.
USPC ............ 365/200; 365/185.09; 365/189.07; 365/189.17; 365/201
(58) Field of Classification Search
USPC ............ 365/154, 189.07, 189.12, 189.17, 365/185.09, 200, 201
See application file for complete search history.

(56) References Cited

U.S. PATENT DOCUMENTS

| | | | | |
|---|---|---|---|---|
| 5,278,793 | A  * | 1/1994 | Yeh ............................. | 365/200 |
| 6,115,828 | A  * | 9/2000 | Tsutsumi et al. ............ | 714/6.32 |
| 6,363,020 | B1 * | 3/2002 | Shubat et al. ................ | 365/200 |
| 6,694,448 | B2  | 2/2004 | Callahan | |
| 6,829,181 | B1 * | 12/2004 | Seitoh ......................... | 365/201 |
| 6,882,583 | B2  | 4/2005 | Gorman et al. | |
| 6,930,934 | B2  | 8/2005 | Wang | |
| 7,061,815 | B2 * | 6/2006 | Ahmad ........................ | 365/200 |
| 7,505,319 | B2  | 3/2009 | Wu et al. | |
| 2009/0268515 | A1 | 10/2009 | Jeong et al. | |
| 2009/0303813 | A1 * | 12/2009 | Fekih-Romdhane ......... | 365/200 |
| 2010/0074039 | A1 * | 3/2010 | Kondo ......................... | 365/200 |

FOREIGN PATENT DOCUMENTS

KR  10-2008-0063874  7/2008

* cited by examiner

*Primary Examiner* — Tha-O H Bui
(74) *Attorney, Agent, or Firm* — Slater & Matsil, L.L.P.

(57) ABSTRACT

A circuit includes a failure address register configured to store a first row address, a row address modifier coupled to the failure address register, wherein the row address modifier is configured to modify the first row address received from the failure address register to generate a second row address. A first comparator is configured to receive and compare the first row address and a third row address. A second comparator is configured to receive and compare the second row address and the third row address. The first and the second row addresses are failed row addresses in a memory.

20 Claims, 2 Drawing Sheets

PROVIDING ROW REDUNDANCY TO SOLVE VERTICAL TWIN BIT FAILURES

BACKGROUND

Vertical Twin Bit (VTB) failures are commonly observed in memories. A VTB failure refers to the failure of two bits that are in neighboring rows, and possibly in the same column. Statistic results have shown that among all Static Random Access Memory (SRAM) failures, single-bit failures have the highest rate of 67.4 percent, followed by the VTB failure rate of about 12.1 percent. Therefore, row redundancy was provided to solve the VTB failures, wherein two redundant rows were provided to fix a VTB failure.

When VTB failures are found, and the failed bits are identified, the rows (referred to as failed rows hereinafter) in which the failed bits are located are replaced by the redundant rows. For a VTB failure, two redundant rows are needed, each replacing one of the failed rows. The addresses of the failed rows need to be stored, so that each time a read operation is performed to one of the failed rows, the data are read from the respective redundant rows instead. Similarly, each time a write operation is performed to one of the failed rows, the data to be written are actually written into the respective one of the redundant rows instead.

Each of the addresses of the failed rows was typically stored in a set of D flip-flops. In addition, the set of D flip-flops also includes an addition D flip-flop storing an "Enable" bit in a separate D flip-flop. A "true" in the "Enable" bit indicates that this set of D flip-flops is enabled to store a row address. Two sets of D flip-flops are needed, each corresponding to one of the two failed rows.

A comparator is provided for each set of D flip-flops, and for each of the read/write operations, the row address corresponding to the read/write operation is compared to the row address stored in the respective D flip-flops. If the row address of the read/write operation matches the row address stored in the respective D flip-flops, a hit is found, and the row on which the read/write operation is performed is replaced with a respective redundant row.

The number of D flip-flops in each set is equal to ($\log_2$ N)+1, wherein "N" is an integer representing the total number of rows in the memory, and integer "1" represents the D flip-flop used by the "Enable" bit. For example, for a memory array having 2048 rows, each set of D flip-flops needs 12 D flip-flops. Since there are two failed rows involved in a VTB failure, 24 D flip-flops are needed. Therefore, by using this method, although the coverage for repairing VTB failures is 100 percent, the chip area penalty for forming two sets of D flip-flops is also high.

In another method, the row address stored in the D flip-flops does not include the least significant bit (LSB) of the failed row(s). The remaining bits of the row address (referred to as upper bits hereinafter) are stored in the D flip-flops. Since the LSB can be either "1" or "0," the stored upper bits of the row address correspond to two row addresses. In this method, only one set of row address is stored, and one comparator is provided, which compares the upper bits of the row address of the row on which the read/write operation is performed with the upper bits of the row address stored in the D flip-flops. The LSBs are not compared.

This method, however, can only be used to repair two neighboring rows whose upper bits are identical. If the upper bits of two failed neighboring rows are different, the stored row address can only record one of the failed rows, and the repair coverage is 50 percent. For example, if the VTB failure occurs in rows [0000] and [0001], since their upper bits are both [000], the failure for both rows can be repaired. If the VTB failure occurs in rows [0010] and [0011], since their upper bits are both [001], the failure can also be repaired. However, if the VTB failure occurs in rows [0001] and [0010], although these two rows are neighboring rows, since their upper bits are [000] and [001], the D flip-flops can only record one of [000] and [001]. As a result, only one of failed rows [0001] and [0010] can be repaired, and the other cannot be repaired. For this method, the reduction in the chip area usage occurs with the cost of reliability.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel Vertical Twin Bit (VTB) repair circuit is provided in accordance with an embodiment. The variations and the operation of the embodiment are discussed. Throughout the various views and illustrative embodiments, like reference numbers are used to designate like elements.

Figure 1:
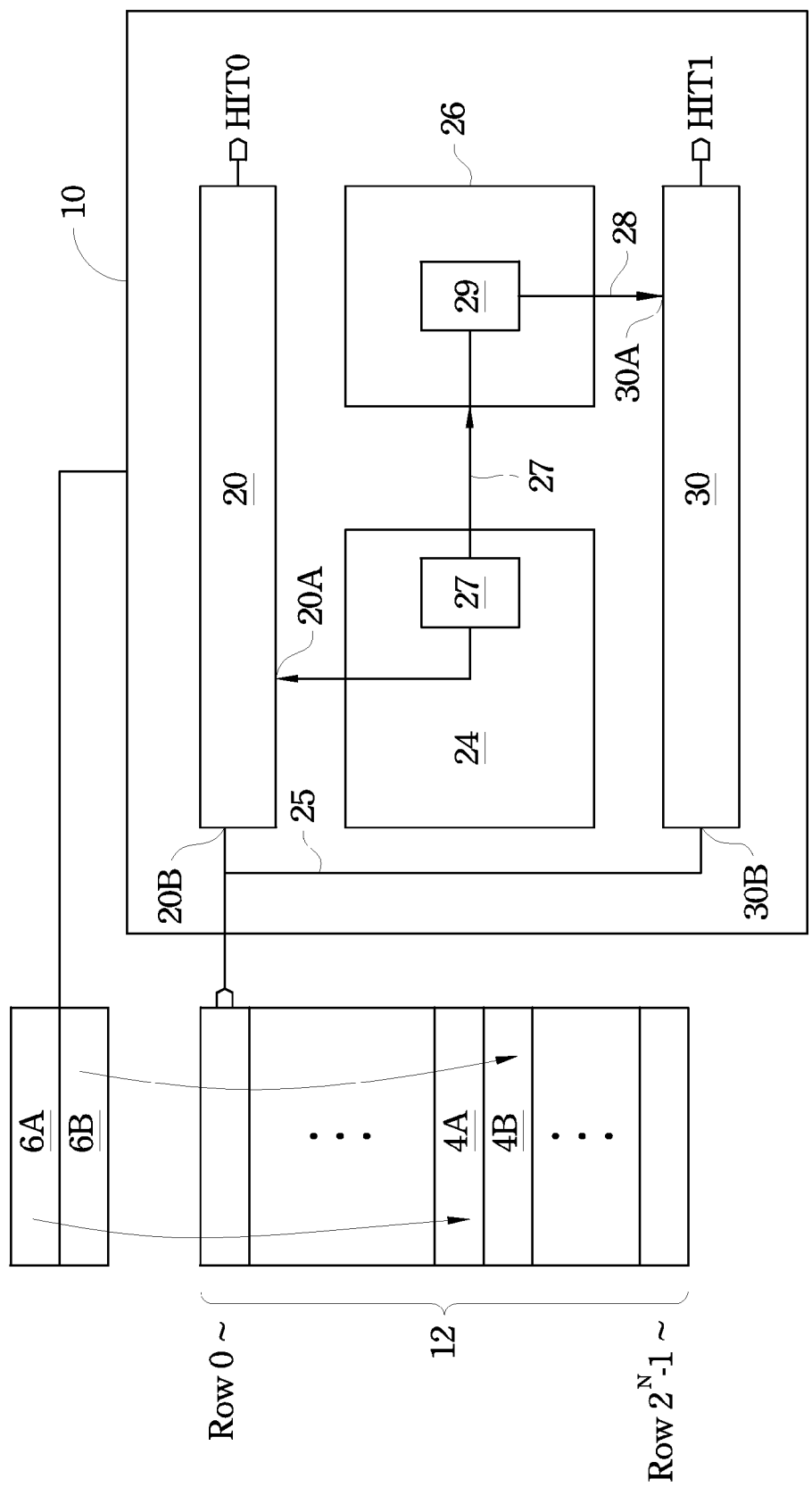
FIG. 1 illustrates a block diagram of a Vertical Twin Bit (VTB) repair circuit in accordance with an embodiment.

FIG. 1 illustrates a block diagram of VTB repair circuit 10 in accordance with an embodiment. VTB repair circuit 10 includes failure address register 24, which are used to store the row address of one of failed rows involved in a VTB failure. VTB repair circuit 10 is configured to repair VTB failures in memory 12, which is coupled to VTB repair circuit 10. The failed rows (for example, rows 4A and 4B) are the rows of memory 12, in which the VTB failure occurs. Failed rows 4A and 4B are neighboring rows, with the row address of row 4B being greater than the row address by "1." For example, the row addresses of rows 4A and 4B may be [0011] and [01000], respectively. Accordingly, the row address of row 4B may be obtained by adding one to) the least significant bit (LSB) of) the row address of row 4A. Conversely, the row address of row 4A may be obtained by subtracting one from (the LSB of) the row address of row 4B.

Redundant rows 6A and 6B may be used to replace failed rows 4A and 4B, respectively. Redundant rows 6A and 6B are coupled to, and are controlled by, VTB repair circuit 10. Whenever a read or a write operation needs to be performed on failed rows 4A and/or 4B, the read or write operation will be performed on the respective redundant row 6A and/or 6B, respectively.

Memory 12 includes N rows, namely row 0 through row $2^N-1$. Accordingly, the respective row addresses of the rows in memory 12 include $\log_2$ N bits, and the row addresses of the rows in memory 12 may be expressed using binary codes having $\log_2$ N bits. Failure address register 24 stores one, and not both, of the row addresses of failed rows 4A and 4B as row address 27. Throughout the description, row address 27 that is stored in failure address register 24 is referred to as "stored row address" 27. Failure address register 24 is coupled to input 20A of comparator 20, which receives stored row address 27 from failure address register 24. Further, row address 25 is also received by comparator 20 through input 20B. Row address 25 is the row address of a row, on which a read or a write operation is performed. Accordingly, row address 25 is referred to as operation row address hereinafter.

In the comparison of stored row address 27 with operation row address 25, if stored row address 27 is the same as operation row address 25, then a hit is found, and output HIT0 of comparator 20 is set to "true." Otherwise, output HIT0 of comparator 20 is set to "false."

VTB repair circuit 10 further includes row address modifier 26, which is configured to receive stored row address 27 from failure address register 24, modify stored row address 27 to generate modified row address 28, and then output modified row address 28 to input 30A of comparator 30. In an embodiment, row address modifier 26 comprises adder 29, and is configured to add the stored row address by 1. For example, if stored row address 27 is [00111], modified row address 28 is [00111]+1, which is [01000]. In alternative embodiments, row address modifier 26 comprises a subtractor (also illustrated as 29), and is configured to subtract stored row address 27 by 1. For example, if stored row address 27 is [00111], modified row address 28 is [00111]−1, which is [00110].

VTB repair circuit 10 further includes comparator 30, which includes input 30A coupled to row address modifier 26. Comparator 30 receives modified row address 28 from row address modifier 26 through input 30A. Comparator 30 further includes input 30B for receiving operation row address 25, and compares modified row address 28 with operation row address 25. If modified row address 28 is the same as operation row address 25, then a hit is found, and output HIT1 of comparator 30 is set to "true." Otherwise, output HIT1 of comparator 30 is set to "false."

Since each of the VTB failure involves two neighboring rows 4A and 4B whose row addresses have a difference of 1, by storing one of the failed row addresses in failure address register 24, and calculating the other failed row address using row address modifier 26, both failure row addresses involved in the VTB failure can be obtained. When failure address register 24 comprises an adder, the row address of failed row 4A may be stored, and the row address of failed row 4B may be obtained by adding the row address of failed row 4A by 1. Conversely, when failure address register 24 comprises a subtractor, the row address of failed row 4B may be stored, and the row address of failed row 4A may be obtained by subtracting the row address of failed row 4B by 1. Since one, instead of both, of the row addresses of failed rows 4A and 4B is saved, the circuit for saving one of the row addresses of the failed rows includes fewer registers than the circuit for saving both failed row addresses, and hence the chip area is saved.

Figure 2:
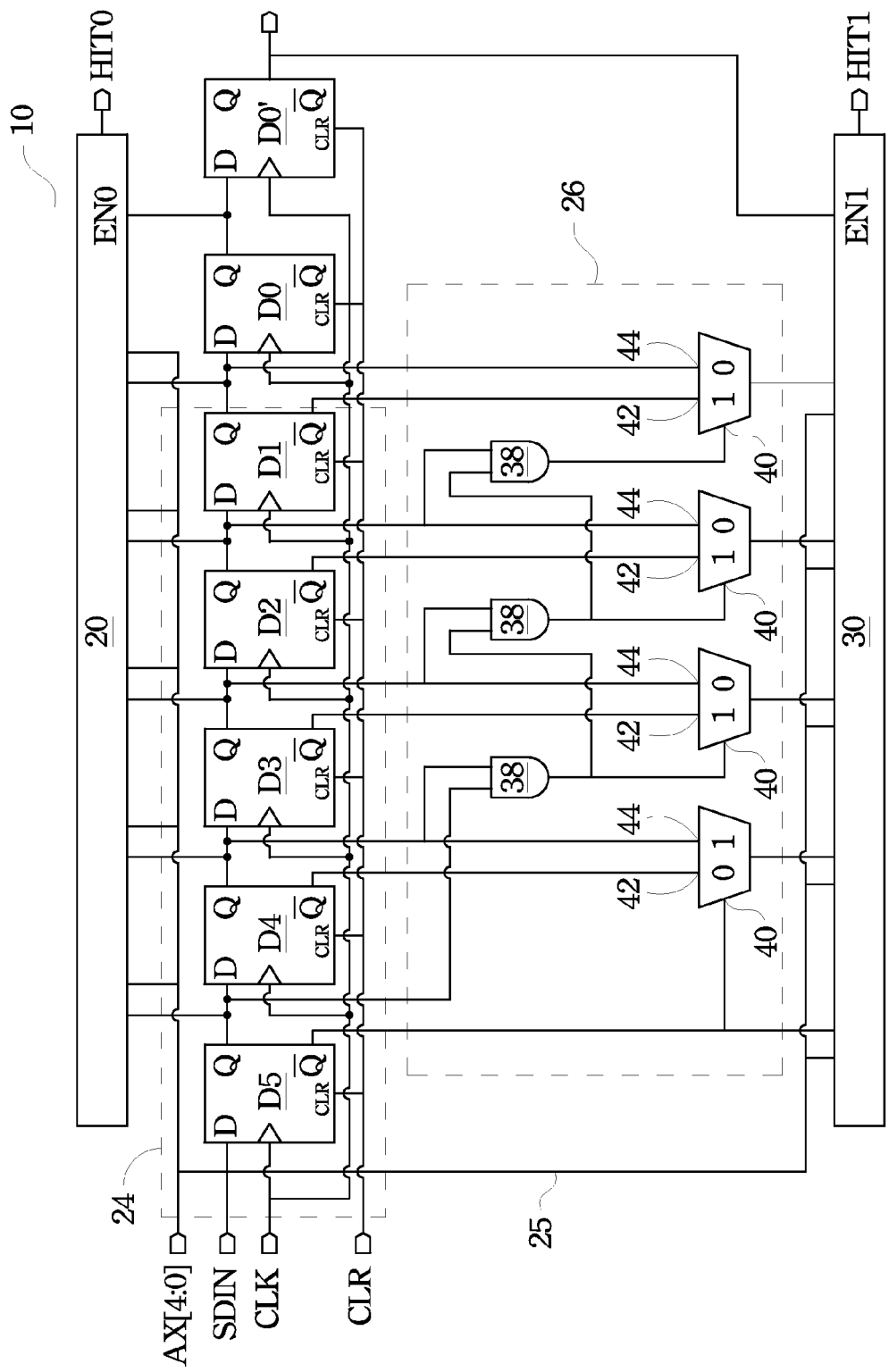
FIG. 2 illustrates an exemplary implementation of the VTB repair circuit as shown in FIG. 1.

FIG. 2 illustrates a portion of a circuit diagram implementing VTB repair circuit 10 as in FIG. 1. In an exemplary embodiment, the registers in failure address register 24 are implemented using D flip-flops, although they may also be implemented using any other bit-storing devices. In the illustrated exemplary implementation, it is assumed that memory 12 includes 32 rows, accordingly, 5 registers (including D1 through D5) are used to store the 5-bit row address, with each of registers D1 through D5 storing one bit. It is realized, however, that actual memories may include more rows, and hence more registers may be comprised in failure address register 24. Register D1 may store the LSB of stored row address 27 (not shown in FIG. 2, please refer to FIG. 1), and register D5 may store the most significant bit (MSB) of stored row address 27. Register D0 stores an "Enable" bit indicating whether failure address register 24 is enabled to store the row address of a failed row (such as row 4A in FIG. 1) or not. Registers D0' stores an "Enable" bit indicating whether the modified row address (such as row address 28 in FIG. 1, which is generated from stored row address 27) is enabled to store the row address of another failed row (such as row 4B in FIG. 1) or not. Address line AX[4:0] is configured to transfer the operation row address (25 in FIG. 1) of the operation row, on which a read or a write operation is performed. Data line SDIN is the serial data input, through which stored row address 27 (FIG. 1) and "Enable" bits D0 and D0' may be sent into registers D1 through D5 serially. Clock signal CLK drives failure address register 24. Signal CLR is used to clear the contents of failure address register 24 and registers D0 and D0'.

In the embodiment as shown in FIG. 2, row address modifier 26 comprises an adder, which includes multiplexers 36 and "AND" gates 38 configured to receive bit values (and/or inverted bit values) from registers D1 through D5. Each of multiplexers 36 includes control input 40 and data inputs 42 and 44. When the value of control input is "0", the value at input 42 is outputted to comparator 30. When the value of control input is "1", the value at input 44 is outputted to comparator 30. The function of row address modifier 26 is to add the row address of stored row address 27 (FIG. 1) by 1 to generate modified row address 28 (FIG. 1), and send the bits of modified row address 28 to comparator 30.

In alternative embodiments, failure address register 24 may be implemented using a subtractor (not shown in FIG. 2, please refer to 29 in FIG. 1), which subtracts stored row address 27 (FIG. 1) that is stored in registers D1 through D5 by 1 to generate modified row address 28 (FIG. 1), and provides modified row address 28 to comparator 30. One skilled in the art will realize the implementation of the substractor.

If the "Enable" bit stored in register D0 is true, comparator 20 compares stored row address 27 (FIG. 1) stored by registers D1 through D5 with operation row address 25 (FIG. 1) that is carried by data line AX[4:0], and the respective output HIT0 is set to true or false, depending on whether stored row address 27 is the same as operation row address 25 or not. Otherwise, if the "Enable" bit stored in register D0 is false, the comparison may not be performed. Hence, as shown in FIG. 2, the output of register D0 is connected to the enablement control input of comparator 20. If the "Enable" bit stored in register D0' is true, comparator 30 compares modified row address 28 (FIG. 1) with operation row address 25 (FIG. 1) carried by data line AX[4:0], and the respective output HIT1 is set to true or false, depending on whether modified row address 28 is the same as operation row address 25 or not. Otherwise, if the "Enable" bit stored in register D0' is false, the comparison may not be performed. Hence, as shown in FIG. 2, the output of register D0' is connected to the enablement control input of comparator 30.

In the embodiment, one, but not both, of the row addresses of the failed rows (such as 4A and 4B) involved in a VTB failure is saved. Accordingly, the chip area usage for the VTB repair circuit is saved. The repair coverage, however, is still one hundred percent.

In accordance with embodiments, a circuit includes a failure address register configured to store a first row address, a row address modifier coupled to the failure address register, wherein the row address modifier is configured to modify the first row address received from the failure address register to generate a second row address. A first comparator is configured to receive and compare the first row address and a third row address. A second comparator is configured to receive and compare the second row address and the third row address. The first and the second row addresses are failed row addresses in a memory.

In accordance with other embodiments, a circuit includes a failure address register including a plurality of D flip-flops connected in series, wherein the failure address register is configured to store a first row address of a memory; and an address line. A first comparator has a first input coupled to the failure address register, and a second input coupled to the address line to receive a second row address of the memory from the address line. The first comparator is configured to compare the first and the second row addresses and output a first comparison result. A row address modifier is coupled to the failure address register, wherein the row address modifier is configured to modify a value of the first row address by 1 to generate a third row address. A second comparator has a first input coupled to the row address modifier, and a second input coupled to the address line to receive the second row address. The second comparator is configured to compare the second row address with the third row address and output a second comparison result. A D flip-flop is coupled in series with the plurality of D flip-flops, wherein an output of the first D flip-flop is coupled to the first comparator.

In accordance with yet other embodiments, a method of providing redundancy to a memory includes retrieving a first row address from a failure address register, wherein the first row address is an address of a first failed row of a VTB failure of a memory; modifying the first row address to generate a second row address, wherein the second row address is an address of a second failed row of the VTB failure; comparing the first row address with a third row address of the memory to generate a first comparison result; and comparing the second row address with the third row address to generate a second comparison result.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit comprising:
   a first comparator comprising a first input configured to receive a first row address of a memory, and a second input configured to receive a second row address of the memory, wherein the first comparator is configured to compare the first and the second row addresses and output a first comparison result;
   a failure address register configured to store the second row address, wherein the failure address register is coupled to the first comparator;
   a row address modifier coupled to the failure address register, wherein the row address modifier is configured to modify the second row address received from the failure address register to generate a third row address; and
   a second comparator comprising a first input configured to receive the third row address from the row address modifier, and a second input configured to receive the first row address, wherein the second comparator is configured to compare the first and the third row addresses and output a second comparison result.

2. The circuit of claim 1, wherein the row address modifier is configured to modify the value of the second row address by one.

3. The circuit of claim 1, wherein the row address modifier comprises an adder configured to add a value onto the second row address.

4. The circuit of claim 1, wherein the row address modifier comprises a subtractor configured to subtract a value from the second row address.

5. The circuit of claim 1 further comprising a first register storing an enablement state of the failure address register, wherein the first register is connected in series with the failure address register, and wherein an output of the first register is connected to an enablement control input of the first comparator.

6. The circuit of claim 1 further comprising a second register storing an enablement state of the third row address, wherein the second register is connected in series with the failure address register, and wherein an output of the second register is connected to an enablement control input of the second comparator.

7. The circuit of claim 1, wherein a total number of bits of the failure address register is equal to $\log_2 N$, and wherein N is a total number of rows of the memory.

8. The circuit of claim 1 further comprising a first and a second redundant row configured to replace a first failed row and a second failed row of the memory, wherein the second and the third row addresses are addresses of the first failed row and a second failed row, respectively.

9. A circuit comprising:
   a failure address register comprising a plurality of D flip-flops connected in series, wherein the failure address register is configured to store a first row address of a memory;
   an address line;
   a first comparator comprising a first input coupled to the failure address register, and a second input coupled to the address line to receive a second row address of the memory from the address line, wherein the first comparator is configured to compare the first and the second row addresses and output a first comparison result;
   a row address modifier coupled to the failure address register, wherein the row address modifier is configured to modify a value of the first row address by 1 to generate a third row address;
   a second comparator comprising a first input coupled to the row address modifier, and a second input coupled to the address line to receive the second row address, wherein the second comparator is configured to compare the second row address with the third row address and output a second comparison result; and
   a first D flip-flop coupled in series with the plurality of D flip-flops, wherein an output of the first D flip-flop is coupled to the first comparator.

10. The circuit of claim 9 further comprising a second D flip-flop coupled in series with the plurality of D flip-flops, wherein an output of the second D flip-flop is coupled to an enablement control input of the second comparator.

11. The circuit of claim 9, wherein the row address modifier comprises an adder configured to add one to a least significant bit of the first row address.

12. The circuit of claim 9, wherein the row address modifier comprises a subtractor configured to subtract one from a least significant bit of the first row address.

13. The circuit of claim 9, wherein an output of the first D flip-flop is connected to an enablement control input of the first comparator.

14. The circuit of claim 9 further comprising a first and a second redundant row configured to replace a first and a second row of the memory corresponding to the first and the third row addresses, respectively.

15. A method of providing redundancy to a memory, the method comprising:
   retrieving a first row address from a failure address register, wherein the first row address is an address of a first failed row of a vertical twin bit (VTB) failure of a memory;
   modifying the first row address to generate a second row address, wherein the second row address is an address of a second failed row of the VTB failure;
   comparing the first row address with a third row address of the memory to generate a first comparison result, wherein the comparing the first row address is performed using a first comparator; and
   comparing the second row address with the third row address to generate a second comparison result, wherein the comparing the second row address is performed using a second comparator separate from the first comparator.

16. The method of claim 15, wherein values of the first and the second row addresses have a difference of one.

17. The method of claim 16, wherein the step of modifying the first row address comprises adding 1 to a least significant bit of the first row address.

18. The method of claim 16, wherein the step of modifying the first row address comprises subtracting a least significant bit of the first row address by one.

19. The method of claim 15 further comprising:
   providing redundancy to the first failed row using a first redundant row; and
   providing redundancy to the second failed row using a second redundant row, wherein read and write operations are performed on the first and the second redundant rows when values of the first and the second comparison results are true.

20. The method of claim 15, further comprising inputting an enablement signal into a register that is connected in series with the failure address register, wherein the enablement signal enables the failure address register to store the address of the first failed row.

* * * * *